(12) United States Patent
Thompson et al.

(10) Patent No.: US 7,688,119 B2
(45) Date of Patent: Mar. 30, 2010

(54) POWER SUPPLY WITH DIGITAL CONTROL LOOP

(75) Inventors: Geoffrey Thompson, Austin, TX (US);
Siddharth Sundar, Austin, TX (US);
Douglas R. Frey, Austin, TX (US);
Russell J. Apfel, Austin, TX (US);
Marius Goldenberg, Austin, TX (US);
Ion C. Tesu, Austin, TX (US); Riad Wahby, Austin, TX (US); Michael J. Mills, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 12/060,268

(22) Filed: Apr. 1, 2008

(65) Prior Publication Data
US 2009/0243701 A1 Oct. 1, 2009

(51) Int. Cl.
*H03K 3/00* (2006.01)
(52) U.S. Cl. .................................. 327/108; 327/365
(58) Field of Classification Search ............... 327/108, 327/365
See application file for complete search history.

(56) References Cited
U.S. PATENT DOCUMENTS 5,656,969 A * 8/1997 Pulvirenti et al. ........... 327/561
6,472,910 B2 * 10/2002 Niimi ......................... 327/108
7,053,699 B2 * 5/2006 North ......................... 327/590
7,535,267 B2 * 5/2009 Osamura ..................... 327/108

* cited by examiner

Primary Examiner—Kenneth B. Wells
(74) Attorney, Agent, or Firm—Davis & Associates; William D. Davis

(57) ABSTRACT

One embodiment of an apparatus for switching a transistor includes a first current mirror providing $i_B = K_1 i_1$, as a transistor base current, wherein the first current mirror is selectively driven by a current source $$\frac{i_{BMAX}}{K_1}.$$

A second current mirror providing a feedback signal $i_2 = K_2 i_D$ to the first current mirror such that $$i_1 + i_2 = \frac{i_{BMAX}}{K_1},$$

wherein $i_D$ contributes to the transistor collector current, wherein $i_B = i_{BMAX} - K_1 K_2 i_D$.

9 Claims, 12 Drawing Sheets

700

POWER SUPPLY WITH DIGITAL CONTROL LOOP

BACKGROUND

Subscriber line interface circuits are typically found in the central office exchange of a telecommunications network. A subscriber line interface circuit (SLIC) provides a communications interface between the digital switching network of a central office and an analog subscriber line. The analog subscriber line connects to a subscriber station or telephone instrument at a location remote from the central office exchange.

The analog subscriber line and subscriber equipment form a subscriber loop. The interface requirements of a SLIC result in the need to provide relatively high voltages and currents for control signaling with respect to the subscriber equipment on the subscriber loop. Voiceband communications are low voltage analog signals on the subscriber loop. Thus the SLIC must detect and transform low voltage analog signals into digital data for transmitting communications received from the subscriber equipment to the digital network. For bi-directional communication, the SLIC must also transform digital data received from the digital network into low voltage analog signals for transmission on the subscriber loop to the subscriber equipment.

A subscriber line interface circuit requires different power supply levels depending upon operational state. One supply level is required when the subscriber equipment is "on hook" and another supply level is required when the subscriber equipment is "off hook". Yet another supply level is required for "ringing".

The SLIC must be provided with a negative voltage supply sufficient to accommodate the most negative loop voltage while maintaining the SLIC internal circuitry in their normal region of operation. In order to ensure sufficient supply levels, a power supply providing a constant or fixed supply level sufficient to meet or exceed the requirements of all of these states may be provided. The use of a single fixed negative power supply tends to result in unnecessary power dissipation.

Another solution is to provide multiple fixed power supplies, each associated with a particular state of the subscriber equipment. The SLIC automatically selects between the multiple fixed power supplies depending upon the state of the subscriber equipment. Although some unnecessary power dissipation may be alleviated, the use of multiple fixed power supplies is disadvantageous. Aside from the inconvenience of multiple supplies, such granularity provides only a coarse reduction of the power dissipation.

SUMMARY

One embodiment of an apparatus for switching a transistor includes a first current mirror providing $i_B = K_1 i_1$ as a transistor base current, wherein the first current mirror is selectively driven by a current source $$\frac{i_{BMAX}}{K_1}.$$

A second current mirror providing a feedback signal $i_2 = K_2 i_D$ to the first current mirror such that $$i_1 + i_2 = \frac{i_{BMAX}}{K_1},$$

wherein $i_D$ contributes to the transistor collector current, wherein $i_B = i_{BMAX} - K_1 K_2 i_D$.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Figure 1:
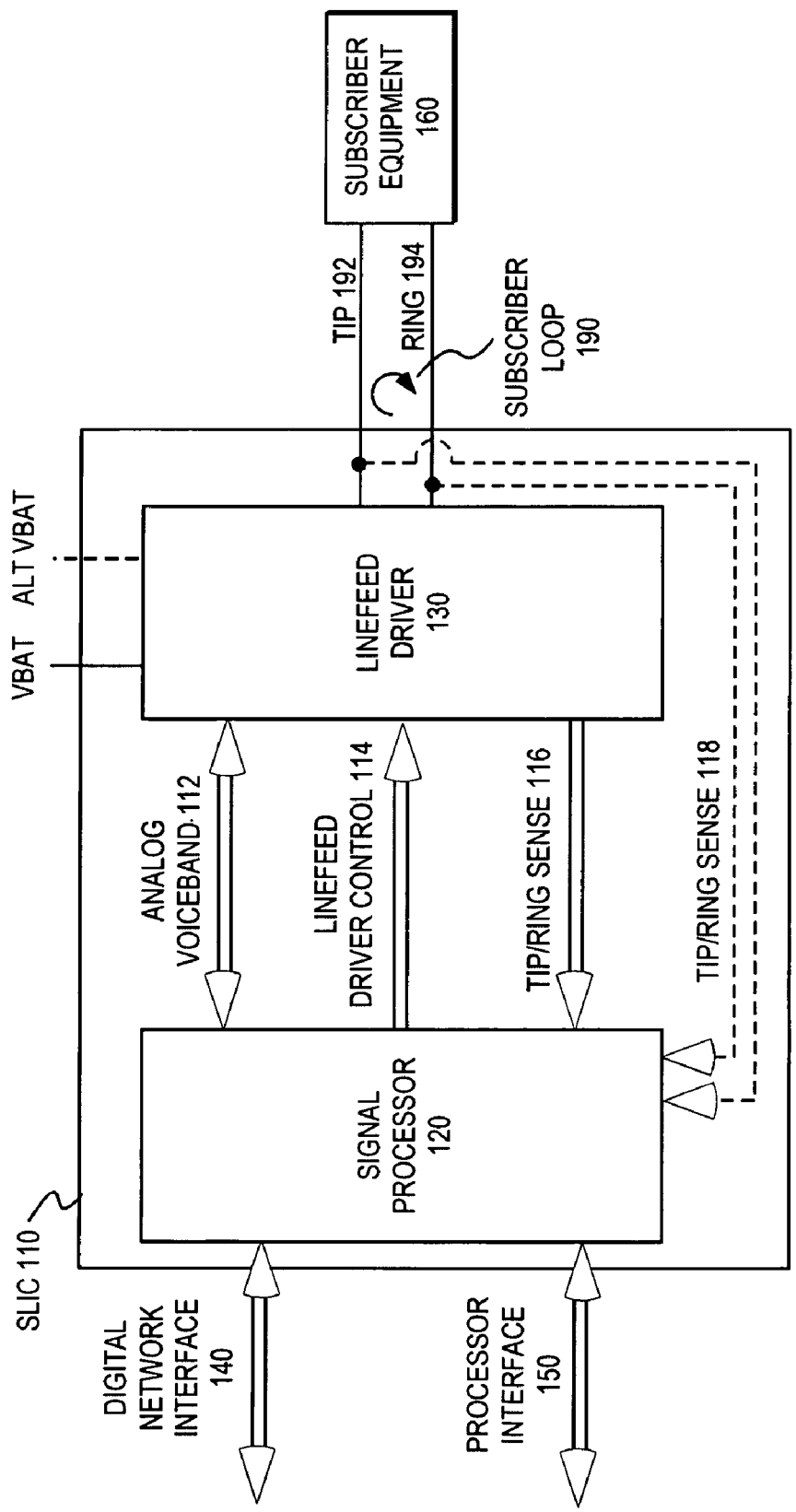
FIG. 1 illustrates one embodiment of a subscriber line interface circuit.

FIG. 1 illustrates one embodiment of a subscriber line interface circuit 110 associated with plain old telephone services (POTS) telephone lines. The subscriber line interface circuit (SLIC) provides an interface between a digital switching network of a local telephone company central exchange and a subscriber line comprising a tip 192 and a ring 194 line. A subscriber loop 190 is formed when the subscriber line is coupled to subscriber equipment 160 such as a telephone.

The subscriber loop 190 communicates analog data signals (e.g., voiceband communications) as well as subscriber loop "handshaking" or control signals. The subscriber loop state is often specified in terms of the tip 192 and ring 194 portions of the subscriber loop.

The SLIC is typically expected to perform a number of functions often collectively referred to as the BORSCHT requirements. BORSCHT is an acronym for "battery feed," "overvoltage protection," "ringing," "supervision," "codec," "hybrid," and "test." The term "linefeed" will be used interchangeably with "battery feed". Modern SLICs may have battery backup, but the supply to the subscriber line is typically not actually provided by a battery despite the retention of the term "battery" to describe the supply (e.g., VBAT).

The ringing function, for example, enables the SLIC to signal the subscriber equipment 160. In one embodiment, subscriber equipment 160 is a telephone. Thus, the ringing function enables the SLIC to ring the telephone.

In the illustrated embodiment, the BORSCHT functions are distributed between a signal processor 120 and a linefeed driver 130. The signal processor and linefeed driver typically reside on a linecard (110) to facilitate installation, maintenance, and repair at a central exchange. Signal processor 120 is responsible for at least the ringing control, supervision, codec, and hybrid functions. Signal processor 120 controls and interprets the large signal subscriber loop control signals as well as handling the small signal analog voiceband data and the digital voiceband data.

In one embodiment, signal processor 120 is an integrated circuit. The integrated circuit includes sense inputs for both a sensed tip and a sensed ring signal of the subscriber loop. The integrated circuit generates subscriber loop linefeed driver control signal in response to the sensed signals. The signal processor has relatively low power requirements and can be implemented in a low voltage integrated circuit operating in the range of approximately 5 volts or less. In one embodiment, the signal processor is fabricated as a complementary metal oxide semiconductor (CMOS) integrated circuit.

Signal processor 120 receives subscriber loop state information from linefeed driver 130 as indicated by tip/ring sense 116. The signal processor may alternatively directly sense the tip and ring as indicated by tip/ring sense 118. This information is used to generate linefeed driver control 114 signals for linefeed driver 130. Analog voiceband 112 data is bi-directionally communicated between linefeed driver 130 and signal processor 120. In an alternative embodiment, analog voiceband signals are communicated downstream to the subscriber equipment via the linefeed driver but upstream analog voiceband signals are extracted from the tip/ring sense 118.

SLIC 110 includes a digital network interface 140 for communicating digitized voiceband data to the digital switching network of the public switched telephone network (PSTN). The SLIC may also include a processor interface 150 to enable programmatic control of the signal processor 120. The processor interface effectively enables programmatic or dynamic control of battery control, battery feed state control, voiceband data amplification and level shifting, longitudinal balance, ringing currents, and other subscriber loop control parameters as well as setting thresholds including ring trip detection and off-hook detection threshold.

Linefeed driver 130 maintains responsibility for battery feed to tip 192 and ring 194. The battery feed and supervision circuitry typically operate in the range of 40-75 volts. The battery feed is negative with respect to ground, however. Moreover, although there may be some crossover, the maximum and minimum voltages utilized in the operation of the battery feed and supervision circuitry (−48 or less to 0 volts) tend to define a range that is substantially distinct from the operational range of the signal processor (e.g., 0-5 volts). In some implementations the ringing function is handled by the same circuitry as the battery feed and supervision circuitry. In other implementations, the ringing function is performed by separate higher voltage ringing circuitry (75-150 $V_{rms}$).

Linefeed driver 130 modifies the large signal tip and ring operating conditions in response to linefeed driver control 114 provided by signal processor 120. This arrangement enables the signal processor to perform processing as needed to handle the majority of the BORSCHT functions. For example, the supervisory functions of ring trip, ground key, and off-hook detection can be determined by signal processor 120 based on operating parameters provided by tip/ring sense 116.

The linefeed driver receives a linefeed supply VBAT for driving the subscriber line for SLIC "on-hook" and "off-hook" operational states. An alternate linefeed supply (ALT VBAT) may be provided to handle the higher voltage levels (75-150 Vrms) associated with ringing.

Figure 2:
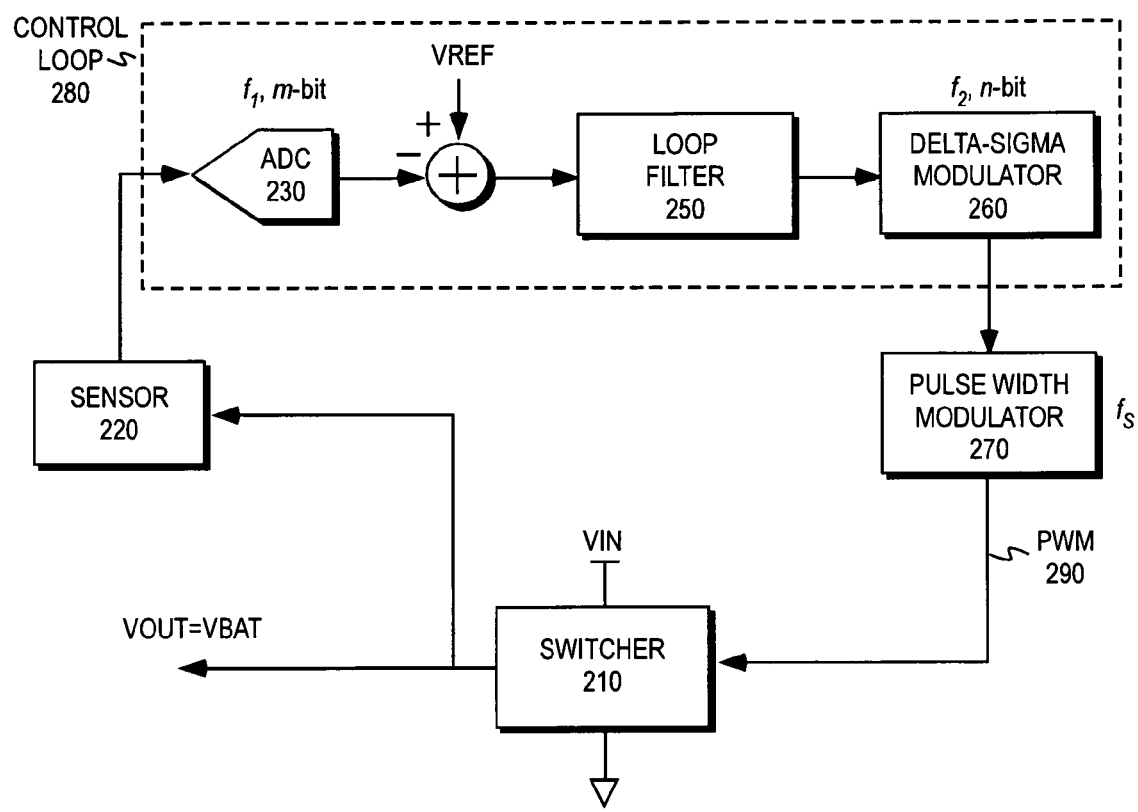
FIG. 2 illustrates one embodiment of a power supply.

A variable power supply can be used to provide a VBAT level suitable for the needs of the SLIC. FIG. 2 illustrates one embodiment of a variable power supply for providing the VBAT required by a SLIC. The power supply is a switching power supply. In particular, the power supply of FIG. 2 is a switching regulator DC-DC converter power supply.

The basic components of a switching regulator include a diode, a switch, and an inductor. Feedback and control circuitry are provided to regulate the transfer of energy from input to output and to maintain the desired VBAT supply levels.

Switcher 210 is switched in accordance with the pulse width modulated control signals from PWM 270 to convert the DC VIN supply to the required DC VBAT supply. Sensor 220 is provided as part of the control loop for VBAT. The control loop may be effectuated in the analog domain or the digital domain.

The switching regulator can generate considerable noise at the switching frequency. VBAT is provided to the linefeed driver and thus any noise present in VBAT can be impressed upon the subscriber line. The switching frequency is located above the typical voiceband range such that interference with voiceband communications is negligible or nonexistent. The subscriber line may be carrying communications other than voiceband communications, however.

An analog control loop has the advantage of introducing no additional quantization noise to VBAT. One disadvantage of an analog control loop, however, is the lack of flexibility. Analog control loops are also inherently more difficult to test than digital control loops.

A digital control loop offers flexibility of control and ease of testing. One disadvantage of digital control loops is the introduction of noise as a result of quantization errors. Consideration of the location of the communication bands is important when choosing switching frequency and control loop parameters.

The control loop in the illustrated embodiment is a digital control loop. Analog-to-digital converter (ADC) 230 samples and quantizes VBAT. Summer 240 compares the quantized VBAT with a digital value corresponding to a reference voltage (VREF) and generates an error signal. The error signal is processed by loop filter 250. The loop filter output is provided to delta-sigma modulator 260.

Figure 3:
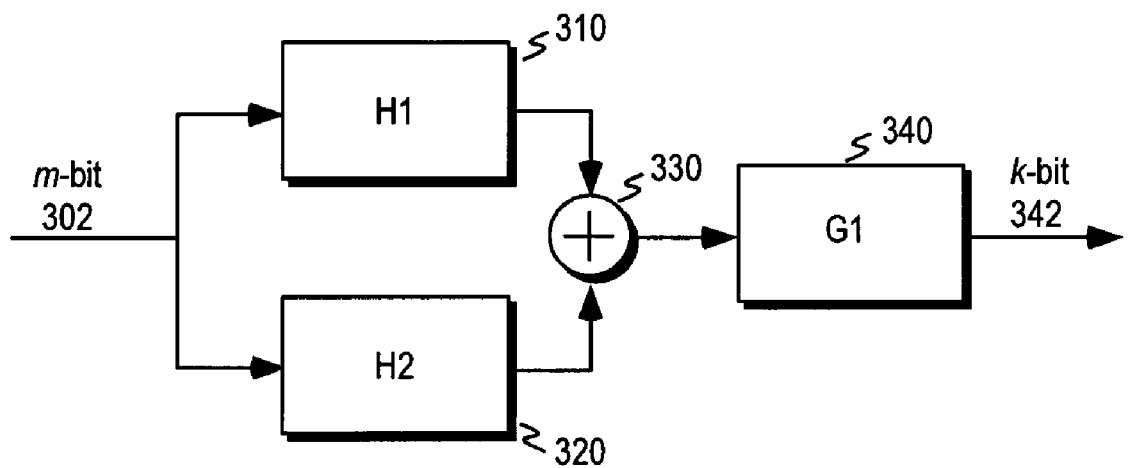
FIG. 3 illustrates one embodiment of a loop filter.

FIG. 3 illustrates one embodiment of the loop filter 300. The loop filter receives an m-bit signal 302 corresponding to VOUT. In the illustrated embodiment, the m-bit signal is concurrently processed by a first element 310 having a transfer function H1 and a second element 320 having a transfer function H2. The output of the first and second elements are summed by summer 330. The output of summer 330 is processed by element 340 having a transfer function H3.

Referring to FIGS. 2 and 3, the loop filter provides loop stability. The transfer function of the loop filter 250 will be dependent upon the particular characteristics of the analog-to-digital converter 230 and the delta-sigma modulator 260. In one embodiment, the elements 310, 320, 340 collectively contribute at least one pole resulting from an integrator and at least one zero to the loop filter transfer function. In one embodiment, H1 provides a gain $G_1$, and H3 provides a gain $G_3$. H2 provides an accumulator (i.e., integrator) and gain function such that the z-transform for H2 is $G_2 z/z-1$ in one embodiment. The resulting output signal of the loop filter is a k-bit signal. In various embodiments k=m, k<m, or k>m. Referring to FIG. 2, the delta-sigma modulator generates the pulse control signal for the pulse width modulator (PWM 270) from the output signal of the loop filter. PWM 270 generates a pulse width modulated signal 290 in accordance with the pulse control signal provided by delta-sigma modulator 260. PWM 270 generates pulses of varying width in accordance with the output of delta sigma modulator 260. This PWM signal is then used to operate switcher 210.

In one embodiment, the sampling and quantization performed by ADC 230 occurs at a first frequency ($f_1$) with m bits of precision. Generally, the sampling frequency must be lower than the PWM switching frequency ($f_S$) for loop stability. The delta-sigma modulator, however, operates at a second frequency ($f_2$) with n bits of precision, wherein m>n but $f_2 > f_1$. In one embodiment, $f_2 = f_S$. Thus the delta-sigma modulator operates with less precision but at a faster rate than ADC 230. Although the delta-sigma modulator provides an n-bit output value, it is important to note that the delta-sigma modulator may utilize p bits internally which are quantized to the n-bit result. Thus although m>n, p may be greater than m.

Although the quantization noise cannot be eliminated, it can be moved to different locations in the spectral domain. The ADC introduces undesired noise at the sampling frequency. The delta-sigma modulator enables shifting of quantization error noise from the sampling frequency to the switching frequency where considerable noise is already present and expected.

Figure 4:
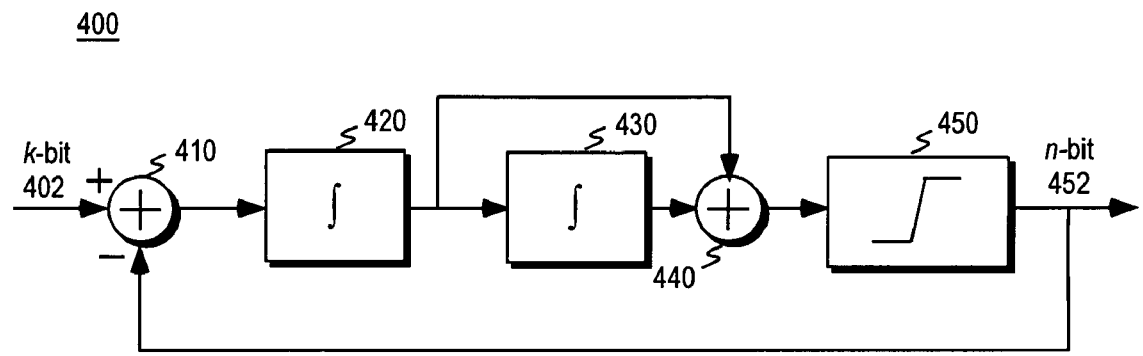
FIG. 4 illustrates one embodiment of a delta-sigma modulator.

FIG. 4 illustrates one embodiment of the delta-sigma modulator 400. Summer 410 receives the k-bit signal 402 from the loop filter and the n-bit output 452 from the modulator. The output of the summer is integrated by a first integrator 420. The output of the first integrator is integrated by a second integrator 430. Within the delta-sigma modulator may be utilizing p-bit values wherein p>k. Summer 440 adds the output of the first 420 and second 430 integrators.

Quantizer 450 quantizes the output of summer 440 to provide the n-bit signal, where m>n. The quantization may be linear or non-linear. For purposes of discussion assume the output of summer 440 is p-bits.

Quantizer 450, for example, may discard r lower significant bits from summer 440 to produce the n-bit pulse control signal. This quantization mapping evenly distributes the possible input values over the range ($2^n$) of possible output values. Each n-bit value will represent $2^r$ input values where p−n=r discarded lower bits.

Examples of non-linear quantization may provide for a ceiling, a floor, or "deadspots" when mapping the input values to the range of possible output values. Such mapping can be utilized to force minimum or maximum duty cycles for the pulse-width modulated signal where appropriate. Similarly, a non-linear mapping may prove useful in conserving power by suppressing pulses where appropriate (e.g., pulse skipping).

One implementation of a non-linear mapping compresses one or both ends of the $2^p$ range of input values while distributing the remaining values equally over the remaining range of possible output values. This compression may be useful for ensuring minimum or maximum duty cycles.

For example, given a desired max value of 90% of $2^n$ (i.e., "max") and a desired minimum value of 10% of $2^n$ (i.e., "min") one can set upper and lower thresholds for the output x of the modulator based upon the input y from the summer 440 as follows:

$$x = \begin{cases} max, & \text{if } y > upper \\ trunc(y, r) & \text{if } lower \leq y \leq upper \\ min, & \text{if } y < lower \end{cases}$$

where x is the n-bit value provided by the delta-sigma modulator and "trunc(y,r)" quantizes y by eliminating r least significant bits of y. Max and min are thus n-bit upper and lower limits for the value of x.

If the upper and lower threshold tests are conducted prior to any other quantization, then y, lower, and upper are all p-bit values. Accordingly, the lower r bits of y are discarded to obtain an n-bit value for x where appropriate.

In another embodiment, the upper and lower threshold tests are conducted on the quantized version of y as follows:

$$x = \begin{cases} max, & \text{if } trunc(y, r) > upper \\ trunc(y, r) & \text{if } lower \leq trunc(y, r) \leq upper \\ min, & \text{if } trunc(y, r) < lower \end{cases}$$

Accordingly, upper and lower are n-bit values rather than r-bit values in such an implementation.

In one embodiment, the "max" and "min" values can be set to the corresponding equivalent of the upper and lower thresholds in order to effectively compress one or both ends of the $2^n$ range of x. For example, upper might correspond to $0.9 \cdot 2^p$ and lower might correspond to $0.1 \cdot 2^p$ for a p-bit comparison. If an n-bit comparison is performed, then one could select max=upper and min=lower. However, a strict correspondence between max and upper or min and lower is not required. Other non-linear mappings that do not provide a uniform distribution of the possible y values across the possible x values may be utilized.

By selecting a different max and min, for example, one can create "deadspots". Thus for example, let upper=90% of $2^n$ and lower=10% of $2^n$. However, let max=$2^n$ and min=0. This creates gaps in the $2^n$ range. In particular, although x can take on values including min and lower, there is a "deadspot" between min and lower such that x cannot take on values between min and lower. Similarly, although x can take on values including max and upper, there is a "deadspot" between upper and max such that x can never take on values between upper and max. One use for such a mapping is pulse suppression. In particular, there may be power consumption, operational state, or other concerns for which pulse suppression is desired.

Referring to FIG. 2, the pulse control signal provided by the delta-sigma modulator 260 is a digital value in one embodiment. The pulse width modulator 270 includes a counter running at a frequency that is a multiple of the frequency of the delta-sigma modulator. The pulse width modulator may initiate a pulse rising edge when the counter is zero. When the counter counts and reaches the pulse control signal value, the pulse width modulator initiates a pulse falling edge.

This basic modulation scheme can be modified to accommodate pulse suppression as described above, if desired. In one embodiment, for example, neither a rising pulse nor a falling pulse will be initiated if the pulse control signal has a value of zero irrespective of the value of the counter. In such a case, the pulse width modulator might simply provide a constant value signal to the DC-DC converter such that no switching occurs. Features such as pulse suppression, maximum duty cycle, and minimum duty cycle may be accomplished by non-linear mapping of the delta-sigma modulator and may be dependent upon the specific operational objectives for the SLIC.

In one embodiment, the nominal frequency of the pulse width modulator is varied depending upon the operational state of the SLIC. Thus for example, one frequency may be utilized when the SLIC is in a ringing state while a different frequency is utilized for an off hook state. Accordingly $f_s$ may be varied in accordance with an operational state of the SLIC.

Figure 5:
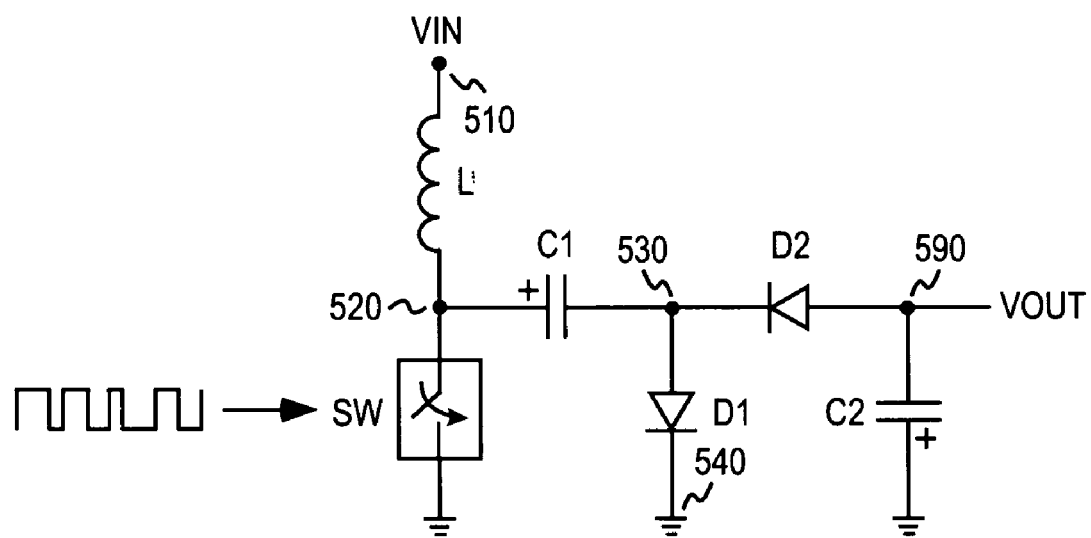
FIG. 5 illustrates one embodiment of a switching regulator.

FIG. 5 illustrates one embodiment of the switching regulator or switcher. This is an inverting topology. VOUT will have a polarity opposite that of VIN. Thus $$sgn\left(\frac{VOUT}{VIN}\right) = -1,$$

where sgn(x) is the signum function and is defined as follows:

$$sgn(x) = \begin{cases} -1, & \text{if } x < 0 \\ 0, & \text{if } x = 0 \\ 1, & \text{if } x > 0 \end{cases}$$

The switching regulator includes an inductor L coupling an input node 510 to a switching node 520. A first capacitor C1 couples the switching node to a diode node 530. A first diode D1 couples the diode node to a common node 540. A second diode D2 couples the diode node to an output node 590. A second capacitor couples the output node 590 to the common node 540. A switch SW selectively couples the switching node to the common node. The first capacitor transfers energy from the input node 510 to the output node 590 in accordance with the commutation of the switch SW.

In one embodiment, the first diode is oriented to be forward-biased when switch SW is open to decouple the switching and common nodes. In contrast, the second diode is oriented to be forward-biased when switch SW is closed to couple the switching and common nodes.

This circuitry is similar to a Ćuk switching regulator in that a capacitor (C1) is the energy storage and transfer device between the input and output nodes. This circuitry may be distinguished from a Ćuk converter by the use of a second diode (D2) in lieu of a second inductor.

Figure 6:
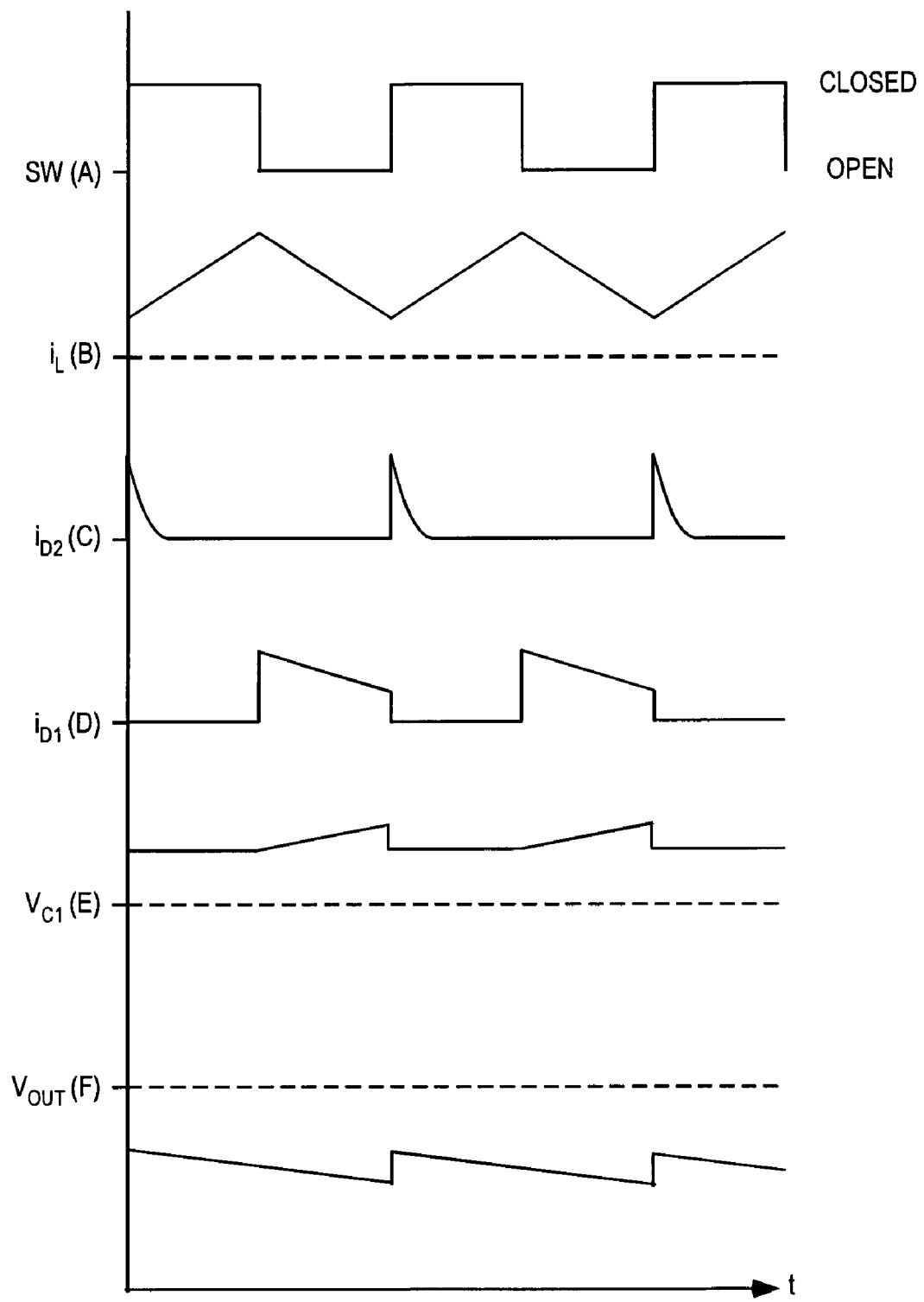
FIG. 6 illustrates waveforms associated with the switching regulator.

FIG. 6 illustrates waveforms associated with the switching regulator of FIG. 5. Waveform (A) corresponds to the opening and closing of switch SW. Waveform (B) represents the current in inductor L. Waveform (C) indicates the current $i_{D2}$ through diode D2. Waveform (D) illustrates the current $i_{D1}$ through diode D1. Waveform (E) illustrates the voltage $V_{C1}$ across capacitor C1. Waveform (F) illustrates the output voltage, VOUT. The scale of the waveforms may vary for ease of comparison.

Referring to FIG. 5, the switch SW must be capable of commutating significant current. Although field effect transistors may be utilized, a bipolar junction transistor may be more appropriate due to the low voltage required for controlling the switch.

Figure 7:
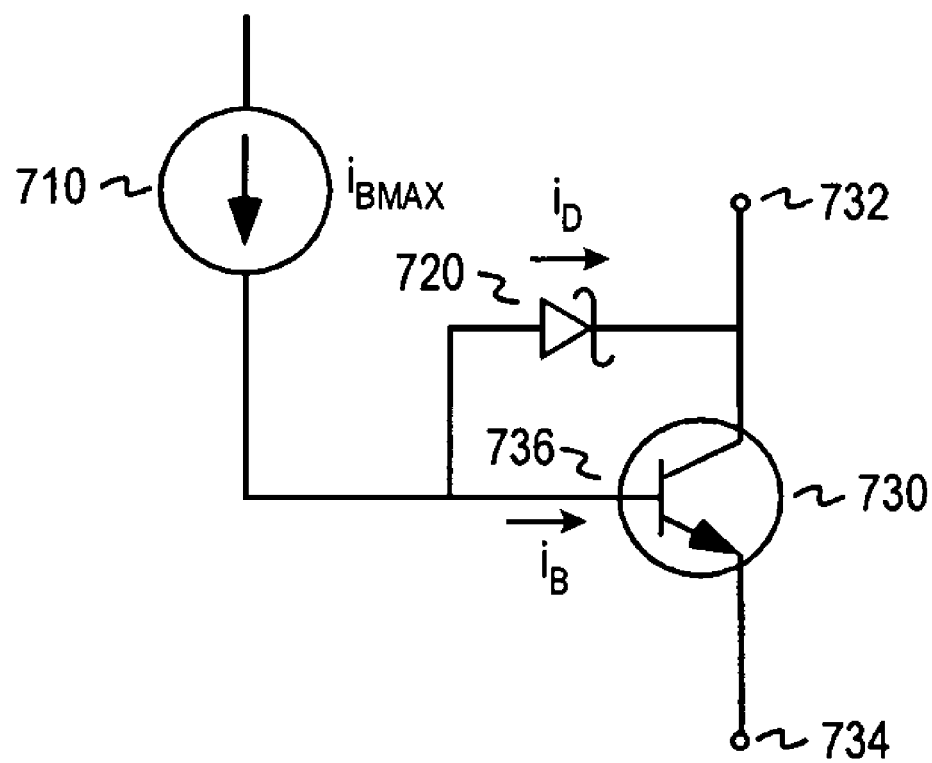
FIG. 7 illustrates one embodiment of a prior art switch.

FIG. 7 illustrates one embodiment of a prior art transistor switch 700 that may be used for switch SW of FIG. 5. A Schottky diode 720 is used to clamp the base 736 and collector 732 of a bipolar junction transistor 730 to aid in fast switching.

Switching the transistor off requires removing the excess charge carriers from the base junction. Fully saturated transistors thus take longer to turn off than transistors that are not fully saturated. The Schottky clamp prevents full or deep saturation by diverting a portion of the base current to the collector once the Schottky diode is sufficiently forward biased. Although this approach may successfully prevent full saturation by the clamping and limiting the current that enters the base, this approach wastes power because the excess current is simply diverted to the collector.

The current source 710 is designed to ensure that sufficient current is available to turn the transistor on. Consider a design parameter of $i_{BMAX}$ as the maximum value for $i_B$. Current source 710 must provide $i_{BMAX}$. However, the total current consumed when the switch is on is always $i_{BMAX}$. In particular, $i_{TOT} = i_B + i_D = i_{BMAX}$ whenever the switch 700 is on.

Figure 8:
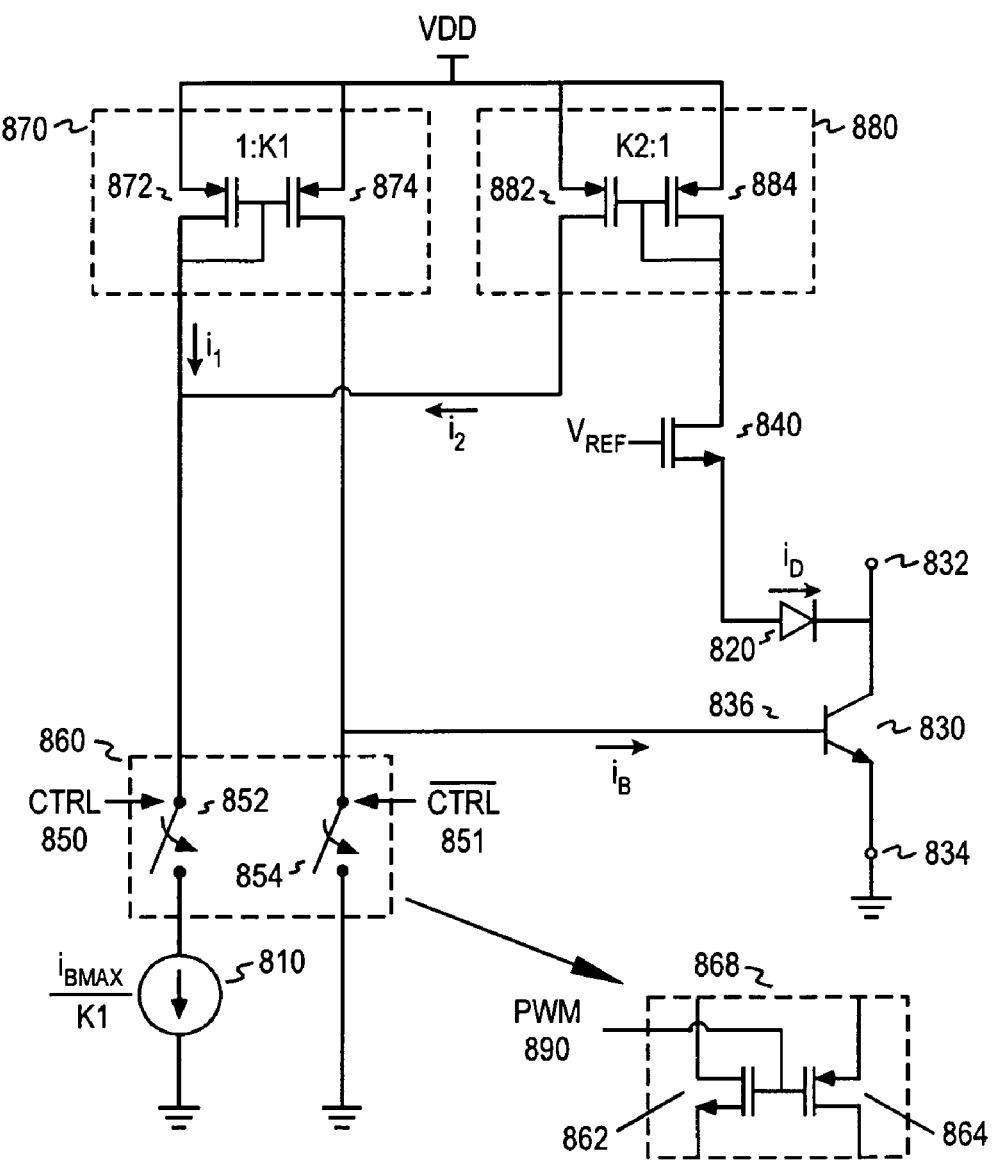
FIG. 8 illustrates an alternative embodiment of a switch.

FIG. 8 illustrates an alternative embodiment of a switch. Instead of simply diverting the excess current from the base, the total amount of current provided is reduced to substantially eliminate any excess current while maintaining the base current at a desired level.

In the illustrated embodiment, a control signal CTRL 850 controls actuator switches 860 to commutate switch 800. Actuator switch 852 is commutated in response to CTRL 850 while actuator switch 854 is commutated in response to the complementary signal $\overline{CTRL}$ 851.

One embodiment of actuator switches 860 is illustrated in callout 868. The functionality of actuator switch 852 is provided by actuator transistor 862 and the functionality of switch 854 is provided by actuator transistor 864.

Actuator transistor 864 is of a complementary type to that of actuator transistor 862. In one embodiment, actuator transistor 862 is an n-type transistor and actuator transistor 864 is a p-type transistor. The same control signal is provided to the gate of both transistors. In the illustrated embodiment, the control signal is the pulse width modulated signal PWM 890 corresponding to PWM 290 of FIG. 2.

When switch 800 is "on" and providing a conduction path from the collector 832 to the emitter 834 of transistor 830, actuator switch 852 is closed and actuator switch 854 is open. When switch 800 is "off" such that substantially no current passes through collector 832 to emitter 834 of transistor 830, actuator switch 852 is open and actuator switch 854 is closed.

Switch 800 includes a first current mirror 870 and a second current mirror 880. The first current mirror has an output gain of $K_1$ relative to its input. The input current, $i_1$, of the first current mirror is multiplied by $K_1$ to provide the base current 836 for transistor 830 as its output current (i.e., $i_B = K_1 i_1$).

The second current mirror has an output gain of $K_2$ relative to its input. The input current, $i_D$ of the second current mirror is multiplied by $K_2$ to provide current $i_2$ as its output current (i.e., $i_2 = K_2 i_D$).

Actuator transistor 852 couples the input current $i_1$ of the first current mirror and the output current $i_2$ of the second current mirror to a current source 810. If $i_{BMAX}$ is the desired maximum drive current to be provided to the base 836 of transistor 830, then current source 810 is selected to have a value of $$\frac{i_{BMAX}}{K_1}.$$

Due to the first current mirror 870, the base current $i_B = K_1 i_1$. Current $i_1$, however, varies due to the feedback signal, $i_2$. In particular, $$i_1 + i_2 = \frac{i_{BMAX}}{K_1}, \text{ thus}$$

$$i_B = K_1 \left(\frac{i_{BMAX}}{K_1} - i_2\right)$$

When $i_2=0$, $i_B=i_{BMAX}$.

VREF establishes a desired clamping point for $V_{CE}$ of transistor 830. As VREF increases, then so does $V_{CE}$ and the power consumed by transistor 830 in the "on" state. As VREF increases, however, the less saturated transistor 830 is permitted to become such that the time to switch "off" is decreased. Decreasing VREF decreases $V_{CE}$ and thus the power consumed by transistor 830 in the "on" state. However decreasing VREF also lowers the $V_{CE}$ required before diode 820 turns on. A lower $V_{CE}$ implies deeper saturation and a longer time to switch "off". Thus the value chosen for VREF is a choice of priorities between required switching speed and power consumption of the transistor 830.

The circuitry of FIG. 8 allows for a variable clamping point for $V_{CE}$. In contrast, the clamping point for $V_{CE}$ in the Schottky clamp approach is based upon the characteristics of Schottky diode 720 and is predetermined at the time of manufacture.

In one embodiment, VREF corresponds to a value stored in a register of the signal processor of FIG. 1. Thus in one embodiment, VREF is programmable and may be placed under programmatic control of the SLIC signal processor.

When diode 820 conducts, $i_D>0$. In particular, when $i_B$ exceeds the amount required to maintain transistor 830 at the desired "on" point as determined by VREF, current will flow through diode 820. The current is mirrored by the second current mirror 880 to provide a feedback current, $i_2$. Second current mirror 880 provides a gain of $K_2$ such that $i_2=K_2 i_D$. Thus $$i_B = i_{BMAX} - K_1 K_2 i_D$$

The total current required to keep the switch on may be described as follows:

$$i_{TOT} = i_B + i_D + \frac{i_{BMAX}}{K_1}$$

Substitution leads to the result that $$i_{TOT} = i_{BMAX} - K_1 K_2 i_D + i_D + \frac{i_{BMAX}}{K_1}$$

which may be rewritten as follows:

$$i_{TOT} = \left(1 + \frac{1}{K_1}\right) i_{BMAX} - (K_1 K_2 - 1) i_D$$

If $K_1$ and $K_2$ are selected such that $K_1 \gg 1$ and $K_1 K_2 \gg 1$, then we may approximate as follows:

$$i_{TOT} \approx i_{BMAX} - K_1 K_2 i_D$$

Thus small changes in $i_D$ due to unnecessary overdriving of $i_B$ can result in significant reduction in the total current required.

When the base must be driven with $i_{BMAX}$, there is no current savings compared to the Schottky-clamp example. The switch of FIG. 8 requires more current than the switch of FIG. 7 in order to meet a design criteria of achieving $i_B=i_{BMAX}$ for drive transistor 830. In particular, for $i_D=0$ and $$i_B = i_{BMAX}, \quad i_{TOT} = i_{BMAX} + \frac{i_{BMAX}}{K_1}.$$

As a percentage of $i_{BMAX}$, this increase over the Schottky-clamp requirement may be expressed as $$\frac{100}{K_1}\%.$$

Given $K_1=100$, for example, a very modest additional 1% of $i_{BMAX}$ is required to achieve a drive current of $i_B=i_{BMAX}$ when $i_D=0$.

When $i_D=0$ for the Schottky-clamp approach of FIG. 7, $i_{TOT}=i_B=i_{BMAX}$. However, $i_{TOT}=i_{BMAX}$ irrespective of changes in $i_B$ or $i_D$. Thus $$\frac{\Delta i_{TOT}}{\Delta i_D} = 0$$

for the Schottky-clamp approach. In contrast, the circuitry of FIG. 8 reduces the total current when less than $i_{BMAX}$ is required for $i_B$. In particular, $$\frac{\Delta i_{TOT}}{\Delta i_D} = -(K_1 K_2 - 1)$$

If $K_1$ and $K_2$ are selected such that $K_1 K_2 \gg 1$, then we may approximate as follows:

$$\frac{\Delta i_{TOT}}{\Delta i_D} \approx -K_1 K_2$$

which is consistent with the earlier approximation for $i_{TOT}$.

Whenever $i_B$ exceeds the amount necessary to maintain the transistor sufficiently "on" as determined by VREF, the circuitry of FIG. 8 will cooperate to reduce $i_B$ and therefore the total current required to keep transistor 820 in the desired "on" state. Thus judicious choices of $K_1$ and $K_2$ can result in significant savings. In one embodiment, $K_1>10$ and $K_2>2$. In one embodiment, $K_1 \approx 100$ and $K_2 \approx 4$.

"VBAT" is a term of art with respect to subscriber line interface circuitry. Although VBAT may have been provided by battery supply at one time, VBAT is provided by a regulated supply for modern SLICs. In the previous examples, VBAT is generated from a VSUPPLY using a switching regulator.

In a typical central office, VSUPPLY is ultimately derived from the alternating current power lines of the electrical utility serving the central office. However, in some instances VSUPPLY might actually be battery-based. In order to ensure uninterrupted activity, the central office may rely upon a standby battery supply system in the event of a failure of the electrical utility. There may be other locations or environments where access to an electrical utility is impractical or simply not possible. The ability to accommodate multiple values of VSUPPLY may be desirable.

Higher $$\left|\frac{VOUT}{VIN}\right|$$

ratios tend to put greater stresses on the electronic components utilized for a converter. Such stresses tend to decrease the life expectancy of the components.

The conversion efficiency of the switcher also tends to decrease with such increasing ratios. Lower efficiencies result in a shorter remaining battery time than what would be possible with higher efficiencies. Batteries are not readily re-configurable to provide an optimal VIN to the converter for a desired VOUT. The supply level provided by a battery is determined by the number of cells and whether the cells are coupled in parallel or in series. Although the number or coupling of cells may be changed, the output voltage can only be changed in discrete units related to the cell potential of individual battery cells.

Figure 9:
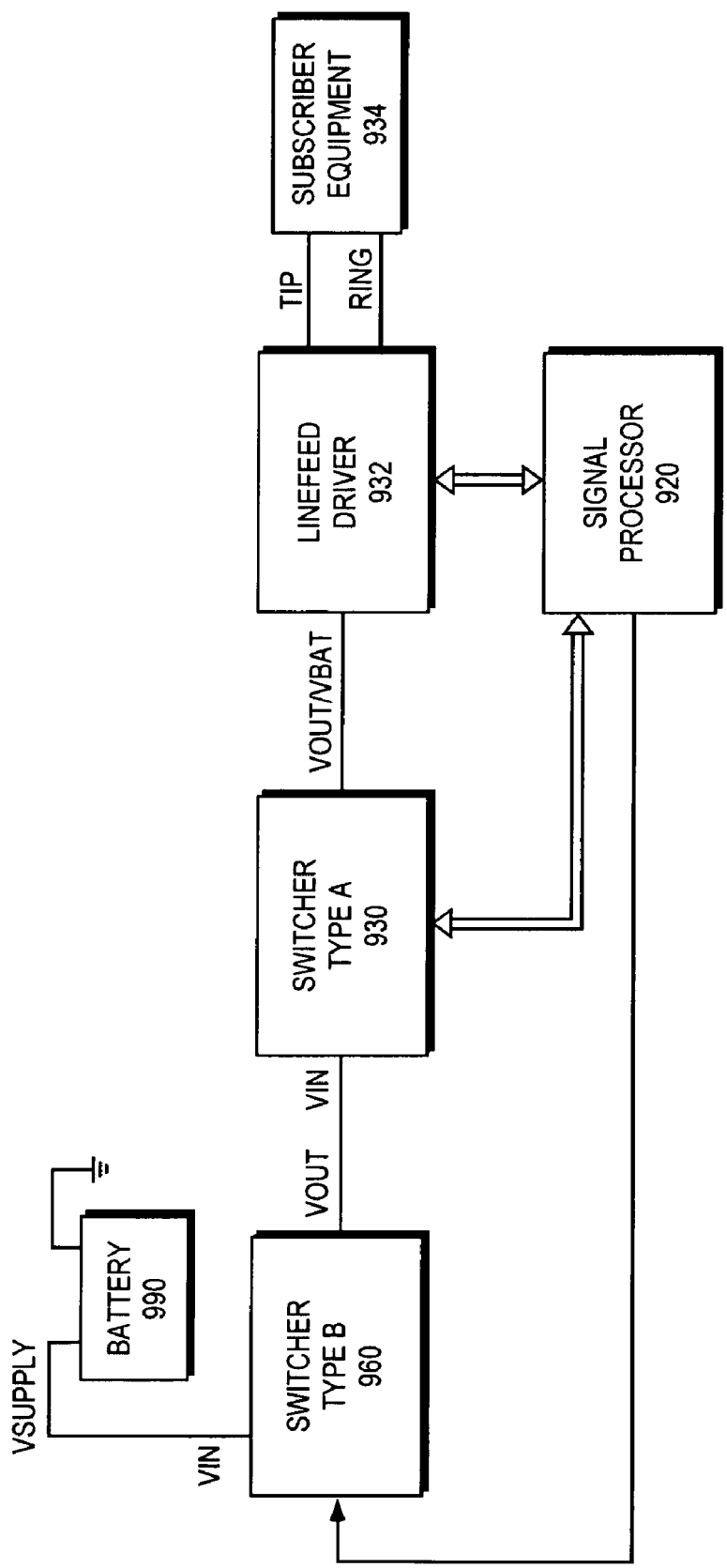
FIG. 9 illustrates one embodiment of a cascaded power supply for a SLIC.

FIG. 9 illustrates one embodiment of a power supply system for a SLIC. The power supply system relies upon cascading switching regulators or switchers as needed to provide the appropriate VBAT. In order to avoid confusion with the term "VBAT", the term VSUPPLY is used to describe the supply from an actual battery 990. The term "VBAT" describes the supply provided to the linefeed driver irrespective of whether VBAT is actually provided by any battery.

In the illustrated embodiment VSUPPLY is provided by one or more batteries such as battery 990. A first switcher receives VSUPPLY as its VIN and provides a VOUT. In one embodiment, the first switcher passes VSUPPLY as-is when the switcher is idle (i.e., VOUT≈VSUPPLY). When commutated, however, the first switcher boosts the VSUPPLY such that $$\frac{VOUT}{VIN} > 1.$$

A second switcher 930 is cascaded from the first switcher 960. The second switcher receives the VOUT of the first switcher as its VIN. The second switcher 930 provides a VOUT that is the VBAT for the linefeed driver 932.

The second switcher is controlled to adjust VBAT as needed for the particular operational state of the subscriber equipment 934 driven by the linefeed driver 932. In the illustrated embodiment, the control of the switcher is provided by the signal processor 920.

The first switcher is of a first type and the second switcher is of a second type. In one embodiment, the second type of switcher is a regulated switcher such as illustrated in FIG. 5. Such regulated switchers are fairly immune to modest changes in their input voltages. Accordingly, the first switcher need only provide a "crude" boost to aid the second type of switcher in achieving the desired VBAT.

Figure 10:
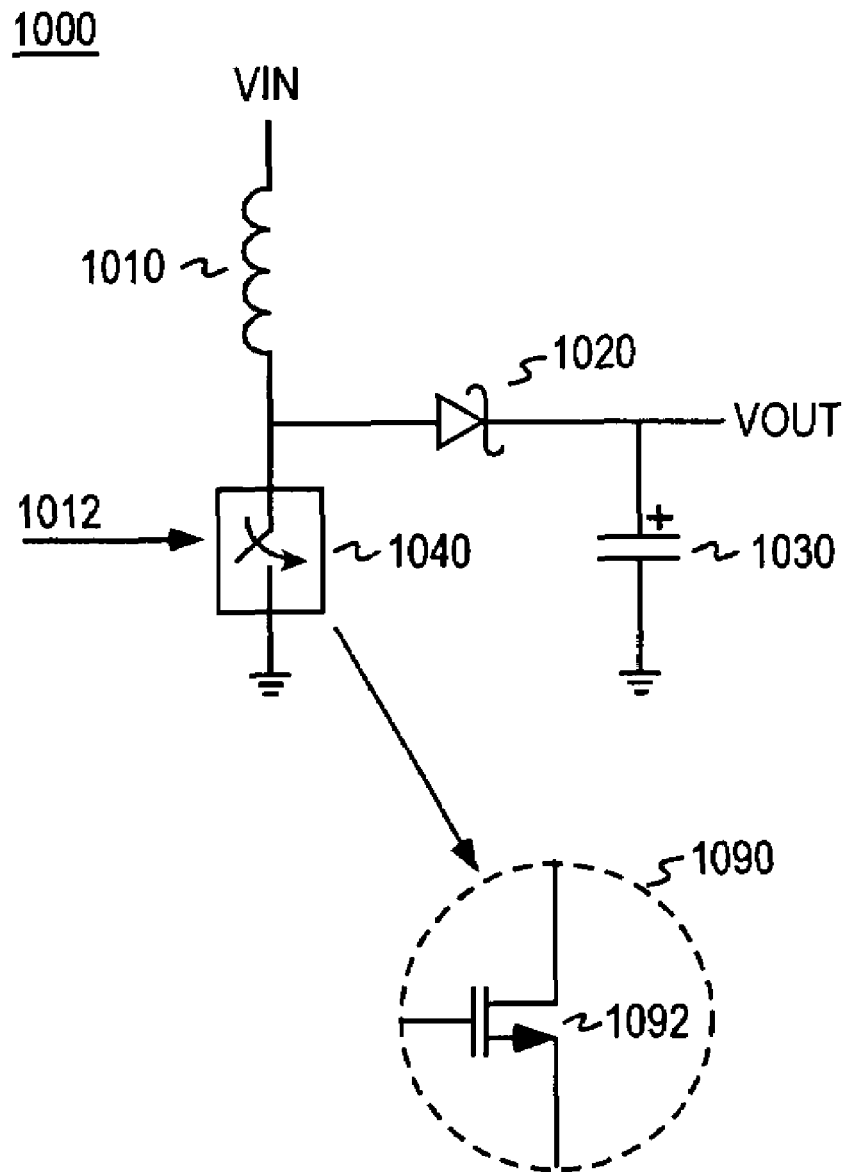
FIG. 10 illustrates one embodiment of a switcher for the cascaded power supply.

One embodiment of a switcher of the first type is illustrated in FIG. 10. The first type of switcher includes an inductor 1010, a diode 1020, a capacitor 1030, and a switching element 1040. As illustrated in callout 1090, the switching element is a MOSFET 1092 in one embodiment. The switching signal 1012 is applied to the gate of the MOSFET in order to turn it on and off.

In the "idle" state, the switching element is not commutated and the switching element does not provide a conducting path to ground (i.e., the switching element is left in an "open circuit" state). As previously noted VOUT≈VSUPPLY in the idle state.

When commutated, the first type of switcher transfers energy from the inductor 1010 to capacitor 1030. The $$\frac{VOUT}{VIN}$$

ratio is determined by the duty cycle and frequency of the switching control 1012.

In one embodiment, switching control 1012 is provided by the signal processor of the SLIC. The first type of switcher can be commutated using an open loop or a closed loop control. However, given that the first switcher is predominately used to crudely boost the supply provided to the second switcher, the signal processor provides switching control 1012 substantially independent of VOUT in one embodiment (i.e., open loop control).

Figure 11:
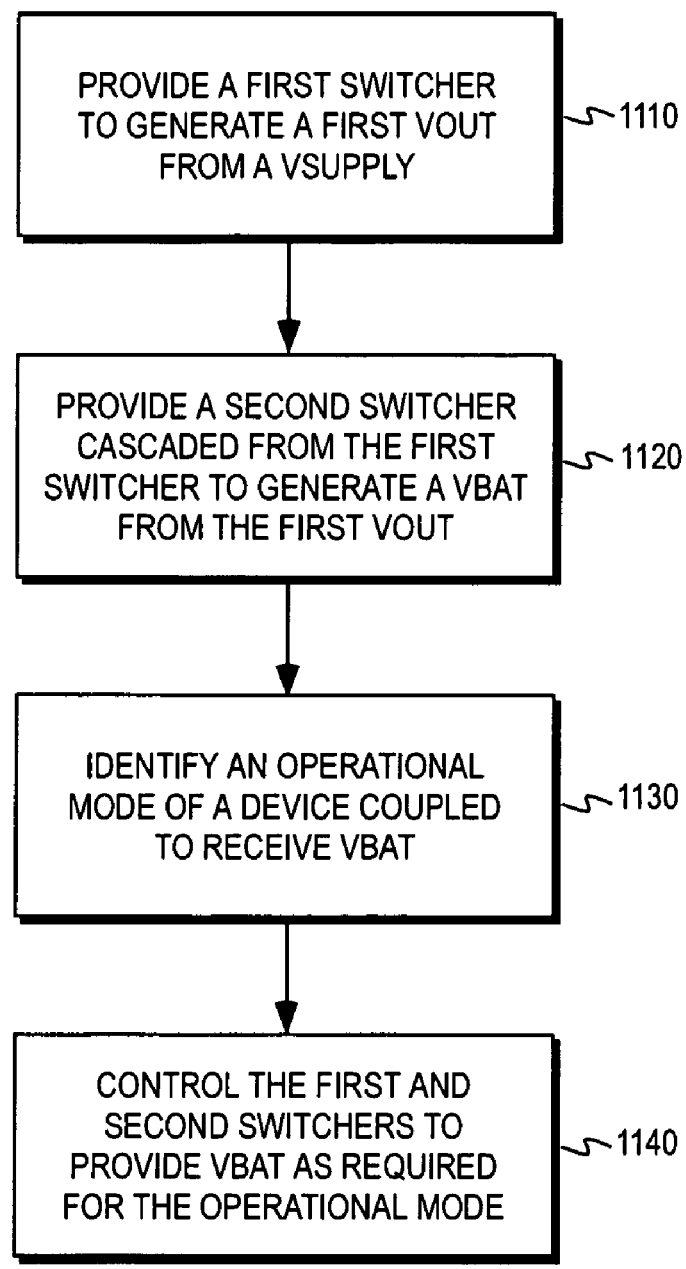
FIG. 11 illustrates one embodiment of a method of controlling cascaded switchers.

FIG. 11 illustrates one embodiment of a method of controlling cascaded switchers to provide a target VBAT supply for a SLIC. At 1110, a first switcher is coupled to generate a first VOUT from a VSUPPLY. In one embodiment VSUPPLY is sourced from a battery. In one embodiment, the first switcher is a pass-through switcher that provides substantially VSUPPLY when the switcher is inactive (i.e., when not being commutated) and provides VOUT with VOUT>VSUPPLY when commutated (i.e., active).

A second switcher is cascaded from the first switcher to generate a VBAT from the first VOUT at 1120. In one embodiment, VBAT is substantially zero when the second switcher is inactive (i.e., not being commutated) and the absolute value of VBAT is greater than the absolute value of the first VOUT when the second switcher is commutated (i.e., active).

An operational mode of a device coupled to receive VBAT is determined at 1130. In one embodiment, the device is subscriber equipment. The subscriber equipment may be a telephone, for example.

The first and second switchers are controlled at 1140 to provide VBAT as required for the operational mode. In one embodiment, the first switcher is inactive unless the device is in a pre-determined operational mode. In one embodiment, the pre-determined mode is a ringing mode.

Figure 12:
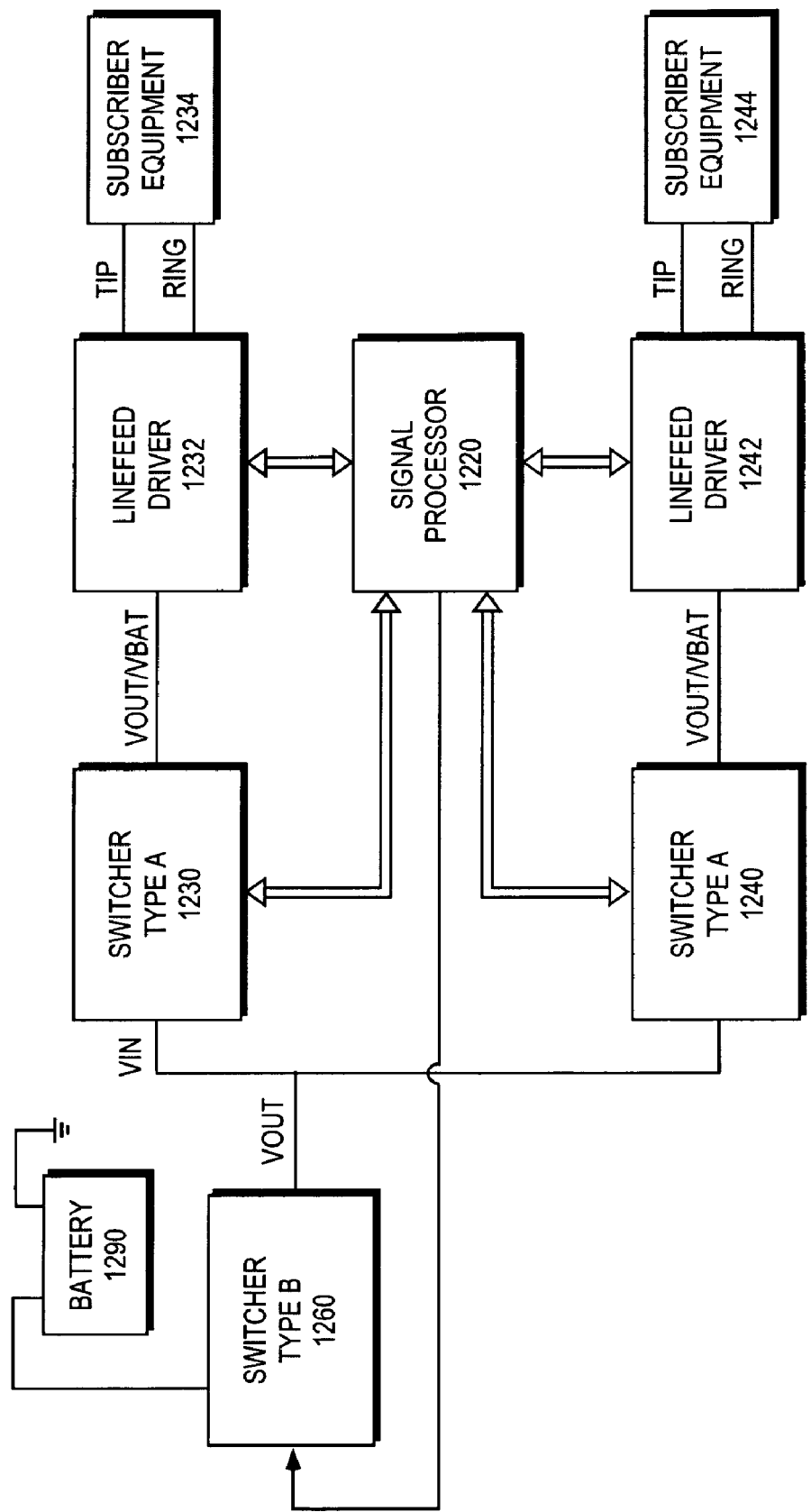
FIG. 12 illustrates one embodiment of a cascaded power supply for a plurality of SLICs.

FIG. 12 illustrates one embodiment of a plurality of SLICs with a power supply provided by cascaded switchers. The power supply system relies upon cascading switching regulators or switchers as needed to provide the appropriate VBAT for each SLIC. Each SLIC may be in a different operational state. In order to avoid confusion with the term "VBAT", the term VSUPPLY is used to describe the supply from an actual battery 1290. The term "VBAT" describes the supply provided to a linefeed driver irrespective of whether VBAT is actually provided by any battery.

In the illustrated embodiment VSUPPLY is provided by one or more batteries such as battery 1290. A first switcher receives VSUPPLY as its VIN and provides a VOUT. In one embodiment, the first switcher 1260 passes VSUPPLY as-is when the switcher is idle (i.e., VOUT≈VSUPPLY). When commutated, however, the first switcher boosts the VSUPPLY such that its $$\frac{VOUT}{VIN} > 1.$$

A second switcher 1230 and a third switcher 1240 are cascaded from the first switcher 1260. The second switcher and third switches each receive the VOUT of the first switcher as its VIN. The second switcher 1230 provides a VOUT that is the VBAT for the linefeed driver 1232. The third switcher 1240 provides a VOUT that is the VBAT for the linefeed driver 1242.

The second and third switchers is controlled to adjust their respective VBAT as needed for the particular operational state of the subscriber equipment 1234 and 1244 driven by the linefeed drivers 1232, 1242 respectively. In the illustrated embodiment, the control of the first switcher 1260, second switcher 1230, and third switcher 1240 is provided by the signal processor 1220.

The first switcher is of a first type. The second and third switchers are of a second type. Thus a plurality of switchers of a second type are cascaded from a first switcher of a first type. In one embodiment, the second type of switcher is a regulated switcher such as illustrated in FIG. 5. Such regulated switchers are fairly immune to modest changes in their input voltages. Accordingly, the first switcher need only provide a "crude" boost to aid the second type of switcher in achieving the desired VBAT. In one embodiment, the first type of switcher is a pass-through regulated switcher such as illustrated in FIG. 10.

In one embodiment, the processor transitions the first switcher to an active state whenever either SLIC enters into a ringing mode. The processor controls each of switchers 1230, 1240 to provide the appropriate VBAT for its respective SLIC's operational mode.

In the preceding detailed description, the invention is described with reference to specific exemplary embodiments thereof. Various modifications and changes may be made thereto without departing from the broader scope of the invention as set forth in the claims. The specification and drawings are, accordingly, to be regarded in an illustrative rather than a restrictive sense.

What is claimed is:

1. An apparatus for switching a transistor, comprising:
a first current mirror providing $i_B = K_1 i_1$ as a transistor base current, wherein the first current mirror is selectively driven by a current source $$\frac{i_{BMAX}}{K_1};$$

a second current mirror providing a feedback signal $i_2 = K_2 i_D$ to the first current mirror such that $$i_1 + i_2 = \frac{i_{BMAX}}{K_1},$$

wherein $i_D$ contributes to the transistor collector current, wherein $i_B = i_{BMAX} - K_1 K_2 i_D$.

2. The apparatus of claim 1 wherein the transistor is a bipolar junction transistor.

3. The apparatus of claim 1 wherein $K_1 > 10$ and $K_2 > 2$.

4. The apparatus of claim 1 wherein $K_1 \approx 100$ and $K_2 \approx 4$.

5. The apparatus of claim 1 further comprising:
actuator switches wherein when a first actuator switch couples the current source to the first current mirror a second actuator switch decouples the transistor base from ground, wherein when the first actuator switch decouples the current source from the first current mirror a second actuator switch couples the transistor base to ground.

6. The apparatus of claim 5 wherein the first actuator switch is a field effect transistor of a first type, wherein the second actuator switch is a field effect transistor of a second type, wherein the first and second types are complementary.

7. The apparatus of claim 1 further comprising a variable clamp to establish a clamping point for the transistor, wherein $i_D$ flows through the clamp only when a collector-to-emitter voltage of the transistor falls below the clamping point.

8. The apparatus of claim 7 wherein the clamp further comprises a diode and a field effect transistor, wherein the clamping point is varied in accordance with a reference voltage applied to a gate of the field effect transistor.

9. An apparatus for switching a transistor comprising:
a first current mirror providing a base current $i_B = K_1 i_1$ to a transistor from a current source $$\frac{i_{BMAX}}{K_1}$$

selectively coupled to the first current mirror;
a second current mirror from which the transistor draws a portion $i_D$ of its collector current when a collector-to-emitter voltage of the transistor falls below a clamping point, wherein the second current source provides a feedback signal $i_2 = K_2 i_D$ to the first current source, wherein $$i_1 + i_2 = \frac{i_{BMAX}}{K_1},$$

wherein $i_B = i_{BMAX} - K_1 K_2 i_D$.

* * * * *